United States Patent [19]

Uchiyama

[11] Patent Number: 5,744,814

[45] Date of Patent: Apr. 28, 1998

[54] METHOD AND APPARATUS FOR SCANNING EXPOSURE HAVING THICKNESS MEASUREMENTS OF A FILM SURFACE

[75] Inventor: Takayuki Uchiyama, Tokyo, Japan

[73] Assignee: NEC Corporation, Japan

[21] Appl. No.: 828,838

[22] Filed: Mar. 24, 1997

[51] Int. Cl.⁶ ............................................. G01N 21/86
[52] U.S. Cl. ................................. 250/559.27; 250/559.4
[58] Field of Search ........................... 250/559.27, 559.4,
250/559.44, 559.22, 548; 356/399–401;
355/55.56, 53

[56] References Cited

U.S. PATENT DOCUMENTS 5,483,056  1/1996  Imai .................................... 250/548

Primary Examiner—Que Le
Attorney, Agent, or Firm—Hayes, Soloway, Hennessey, Grossman & Hage, P.C.

[57] ABSTRACT

A step-and-scan technique for patterning a photoresist film formed on a wafer comprises the steps of storing a relationship between a film thickness and an optimum offset amount of a focal position from the film surface, measuring a first ordinate of the wafer surface at each of the several focusing positions of the wafer, forming a photoresist on the wafer, measuring a second ordinate of the film surface to obtain a film thickness, exposing the photoresist film at each focusing position based on the optimum offset amount of the each focal position which is retrieved based on the film thickness.

6 Claims, 7 Drawing Sheets

METHOD AND APPARATUS FOR SCANNING EXPOSURE HAVING THICKNESS MEASUREMENTS OF A FILM SURFACE

BACKGROUND OF THE INVENTION (a) Field of the Invention

The present invention relates to a method and apparatus for step-and-scan exposure and, more particularly, to a technique for scanning exposure onto a semiconductor surface by using ultraviolet ray, far ultraviolet ray or electron beam.

(b) Description of the Related Art

With the recent increase in integration of an LSI, film patterns on the LSI have become finer and finer whereas chip dimensions have increased. Those trends make a current step-and-repeat exposure method less feasible because the exposure equipment requests a larger lens diameter for the larger chip surface.

A new step-and-scan exposure method has been proposed for the larger chip surface. The proposed technique uses, in addition to a primary scanning of a semiconductor wafer through a reticle while moving the semiconductor wafer in a synchronized speed, a step movement of the semiconductor wafer in the direction perpendicular to the scanning direction of the exposure beam.

FIG. 1 shows the proposed step-and-scan exposure method on a chip of a semiconductor wafer. An exposure slit 501 is of, for example, a 5 mm ×25 mm rectangular shape and scans over the 25 mm ×25 mm chip area in the direction shown by an arrow, i.e. horizontally as viewed in FIG. 1. FIG. 2 shows an exemplified structure of the chip in a sectional view, wherein the chip area for about a single scanning step is illustrated. The wafer 601 is covered by a photoresist film 602 for patterning of the wafer surface. The surface of the wafer 601 has a step difference "H" as large as 1.5 microns after formation of a capacitor film etc. thereon.

The focal position in the vertical direction at which a laser beam is focused is generally determined after observation of the surface position of the photoresist film in the vertical direction at a horizontal local position of the photoresist film. The focal position is then determined at a vertical position in a curved profile 603 within the photoresist film 602 which is apart from the photoresist film surface by a given depth.

The accuracy of the focal position of the exposure laser is critical to a throughput of the semiconductor device for a specified design rule so that the request for the accuracy of the optimum focal position is increasing as the design rule for the transistor elements becomes smaller and smaller.

SUMMARY OF THE INVENTION

In view of the above, it is an object of the present invention to provide a method and apparatus for step-and-scan exposure which is capable of providing an optimum focal position of the scanning laser beam for scanning a film surface.

In accordance with the present invention, there is provided a method for step-and-scan exposure of a film on a semiconductor wafer, including the steps of measuring a film thickness at each focusing position of a film surface, retrieving an optimum offset amount of a focal position from the film surface based on a photoresist characteristic and the film thickness at the each focusing position, and exposing the film with an exposure light for patterning based on the optimum offset amount for the focal position of the exposure light.

In accordance with the present invention, there is also provided an apparatus for step-and-scan exposure of a semiconductor device comprising a measurement device for measuring a film thickness at each focusing position of a film on a semiconductor wafer, a memory device for storing a relationship between a film thickness and an optimum offset amount of a focal position from a film surface for the film thickness, a read device for retrieving an optimum offset amount of a focal position from the film surface at each focusing position based on the film thickness measured by the measurement device, and an exposure device for exposing the film with an exposure light based on the optimum offset amount for the focal point of the exposure light.

In accordance with the method and apparatus of the present invention, an accurate focal position can be obtained throughout the chip area so that the throughput of the semiconductor device can be improved.

The above and other objects, features and advantages of the present invention will be more apparent from the following description, referring to the accompanying drawings.

DESCRIPTION OF THE PREFERRED EMBODIMENTS

Figure 3:
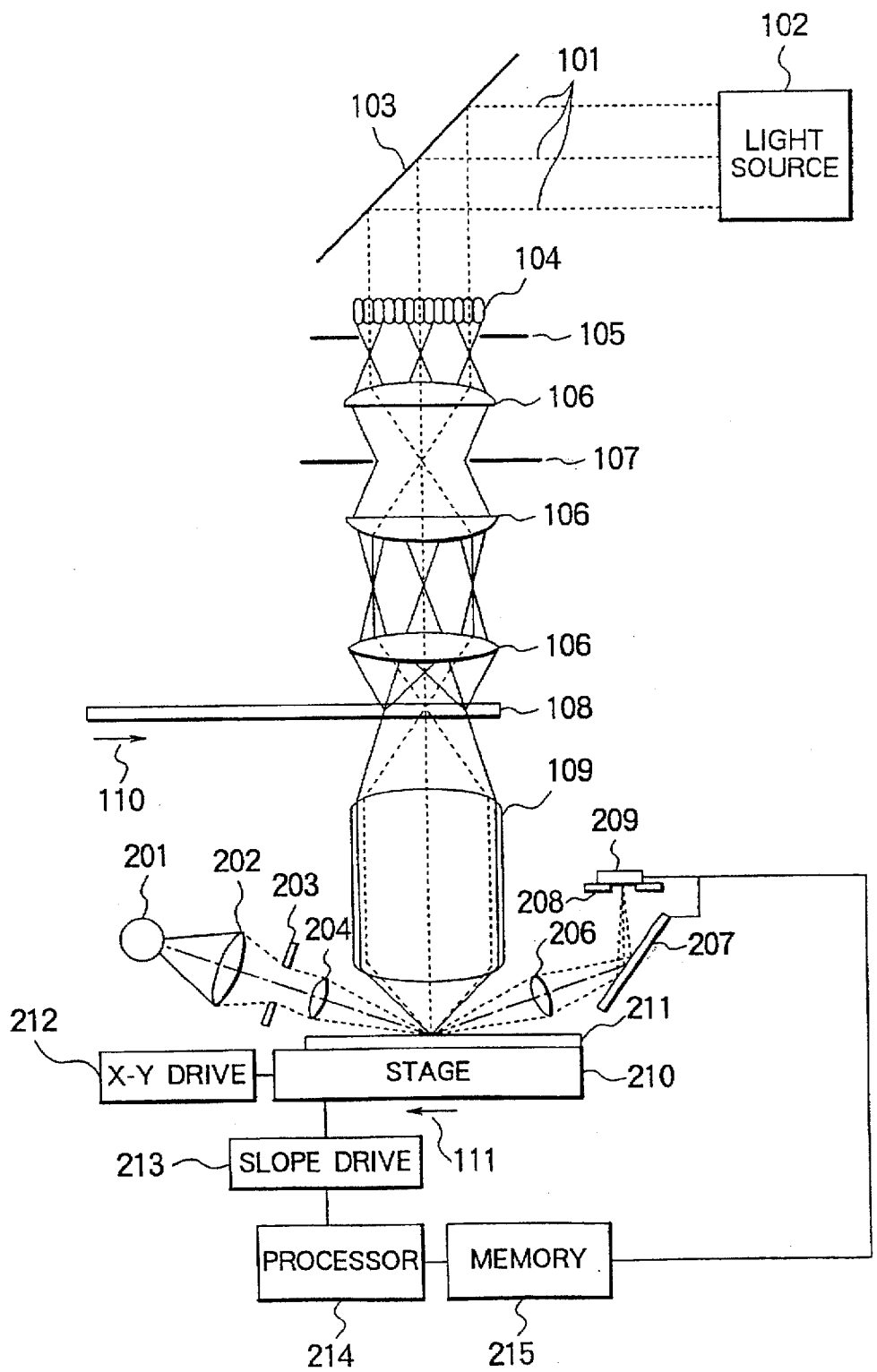
FIG. 3 is a schematic side view of a projection aligner using sep-and-scan technique according to an embodiment of the present invention.

Referring to FIG. 3, a projection aligner using a step-and-scan technique according to a first embodiment of the present invention comprises a light source 102 for emitting a primary light 101, and a set of optical elements, including a reflector 103, fly's eye lens 104 and an aperture diaphragm 105, for passing the primary light to define a secondary light. The defined secondary light for exposure then passes through a plurality of condenser lenses 106 and reticle blind 107 onto a reticle 108, which diffracts the exposure light by the pattern formed thereon. The diffracted light then passes a reduction lens 109 and focused at a specified position of the photoresist film formed on the wafer 211. The projection aligner further comprises a focusing mechanism for focusing the exposure light exactly on the specified position.

The reticle 106 is generally mounted on a reticle stage, not shown, which is reciprocally moved in the horizontal direction designated at an arrow 110, while the wafer 211 is mounted on the wafer stage 210 which is reciprocally moved in the horizontal direction designated at an arrow 111 and opposite to the direction of the movement of the reticle 108 at each instance.

Figure 4:
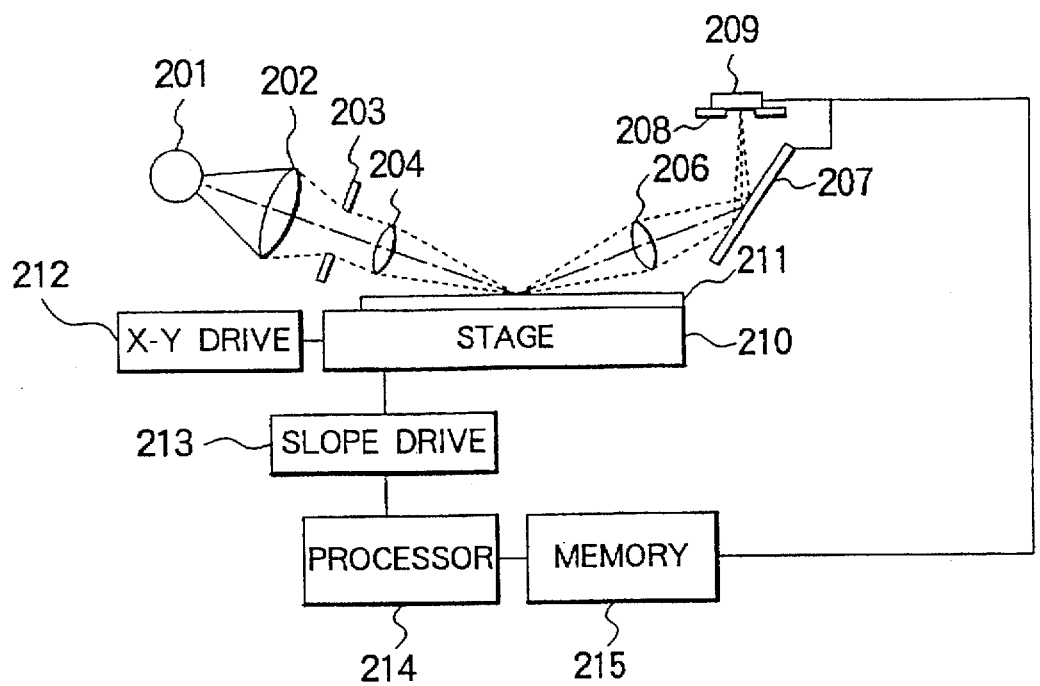
FIG. 4 is a detailed side view of the focusing mechanism used in the projection aligner of FIG. 3.

FIG. 4 shows the focusing mechanism used in the projection aligner of FIG. 3 for controlling the vertical position of the wafer with respect to the focal position of the exposure light. The focusing mechanism comprises an irradiating optical system 201 to 204, a receiving optical system 206 to 209, a signal processor 214 including a memory device 215, and a wafer stage drive including an X-Y drive 212 and a slope drive 213.

The irradiating optical system includes a second light source 201 for emitting a second light (or focusing light) for controlling the wafer position with respect to the focus of the exposure light, and a first concave lens 202, a first focusing slit 203 and a second concave lens 204 for irradiating the second light onto the wafer 211. The receiving optical system includes a third concave lens 206, vibrating mirror 207, a second focusing slit 208 and a photodetector 209 for receiving the reflected focusing light from the wafer 211.

The focusing light has a wavelength to which the photoresist film on the wafer 211 is insensitive. The focusing light received by the photodetector 209 is provided with a minute angle with respect to the perpendicular of the photodetector surface due to the minute angle vibration provided by the vibrating mirror 207. The signal processor 214 calculates the vertical position of the wafer surface based on the amount of the focusing light detected by the photodetector 209 and the minute angle, and actuates the wafer stage X-Y drive 212 and slope drive 213 to obtain an optimum vertical position of the wafer stage 210 for irradiation of the exposure light.

Figure 5:
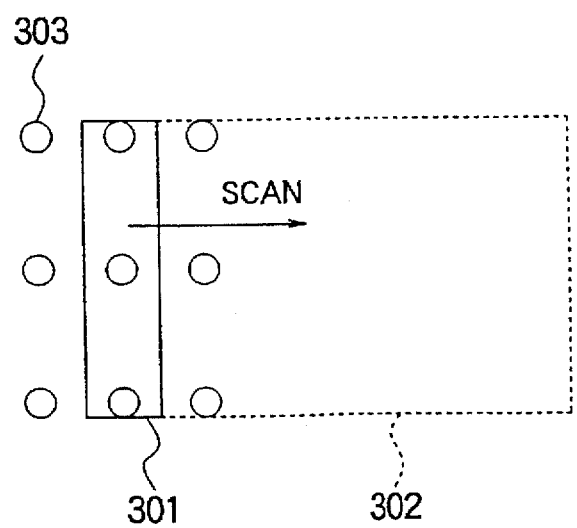
FIG. 5 is a plan view of a chip to be scanned by the projection aligner of FIG. 3, showing focusing position of the projection aligner.

Prior to the exposure step, the signal processor 214 obtains data for the vertical position, i.e., Z-ordinate, of the photoresist film surface across the wafer surface by using the focusing mechanism after the stage drivers 212 and 213 are actuated and then fixed. FIG. 5 shows horizontal focusing positions of the wafer at which the Z-ordinate of the photoresist surface is to be measured by the focusing mechanism. The exposure slit 301 is of a 5 mm×25 mm rectangular shape and the chip area is of a 25 mm×25 mm square. The focusing mechanism measures the Z-ordinate of the photoresist surface at three focusing positions within a single exposure slit to obtain a total of 15 focusing positions on the single chip area.

Figure 6:
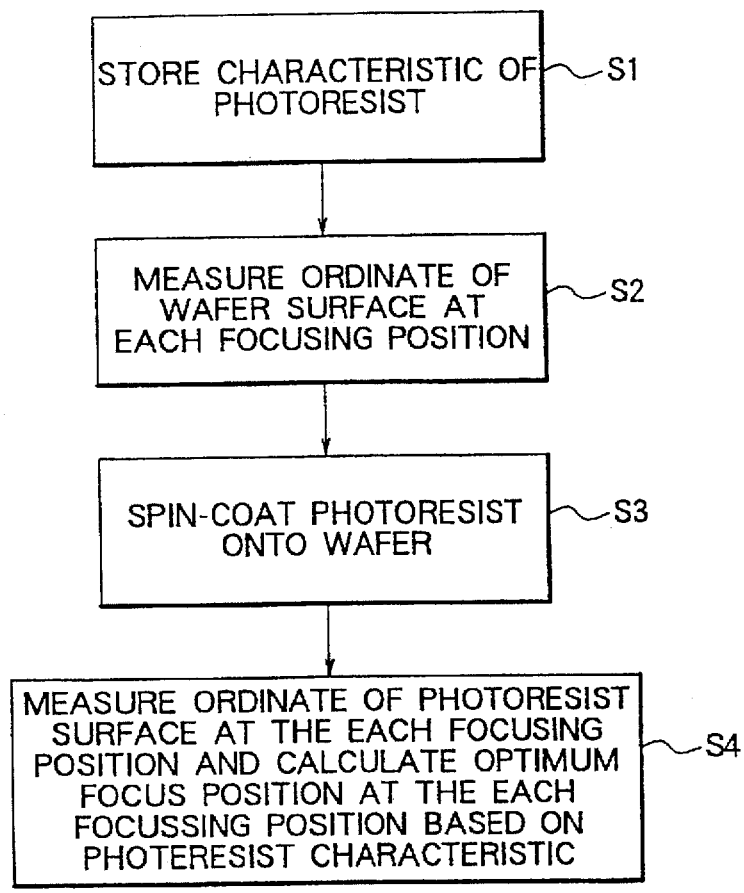
FIG. 6 is a flowchart of the process used in the projection aligner of FIG. 3.
Figure 7:
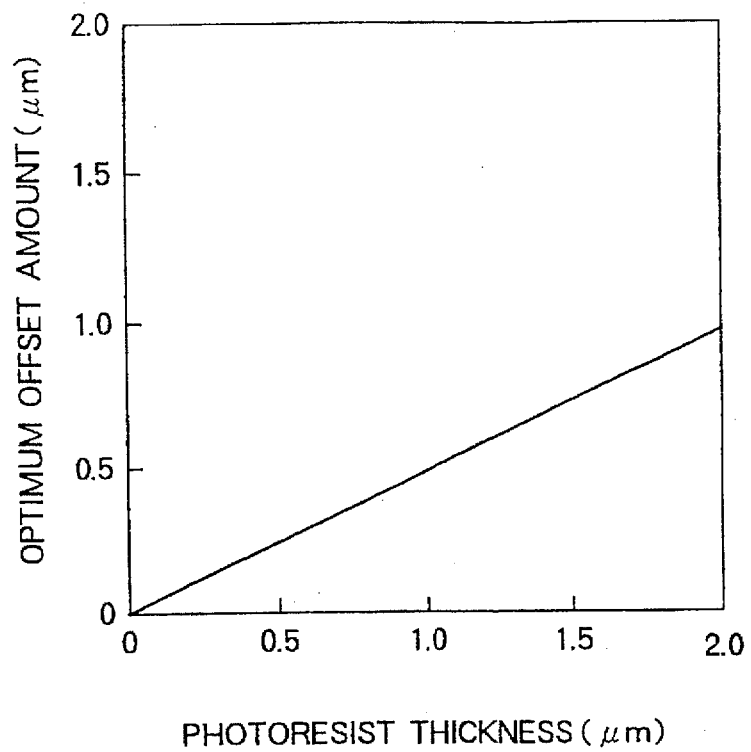
FIG. 7 is a graph for showing a photoresist film thickness dependency of the optimum offset amount deviated from the photoresist film surface.

Referring to FIG. 6, operation for the projection aligner will be described below. Initially, at step S1, the photoresist characteristic as to the relationship between a photoresist thickness and an optimum offset amount of the focal position with respect to the photoresist surface for the photoresist thickness is obtained for a given photoresist material by a record of the photoresist material. The relationship may be such as shown in FIG. 7, wherein it is shown that the optimum offset amount of the focal position with respect to the photoresist surface is approximately half the photoresist thickness. The photoresist characteristic is stored in the memory device before the step-and-scan exposure of the wafer.

At step S2 in FIG. 6, prior to spin-coating the photoresist film onto the wafer, an ordinate for the vertical position of the wafer surface is measured by the focusing mechanism at each focusing position shown in FIG. 5. The ordinate thus obtained is stored in the memory device as a wafer surface profile data.

Photoresist is then spin-coated onto the wafer surface at step S3, and then scanned by the exposure light by using the projection aligner of FIG. 3 including the focusing mechanism, at step S4. At this step, Z-ordinate BF of the focal position of the exposure light is determined as follows:

$$BF = RS - Roff,$$

wherein RS and Roff represent Z-ordinate of the photoresist film surface during the exposure and the optimum offset amount of the focal position as obtained from the photoresist characteristic and a calculated photoresist thickness for each focusing position. The photoresist thickness is obtained by subtraction of the Z-ordinate of the wafer surface for each focusing position in the wafer surface profile data from the Z-ordinate of the photoresist surface measured at each focusing position of the wafer.

Figure 8:
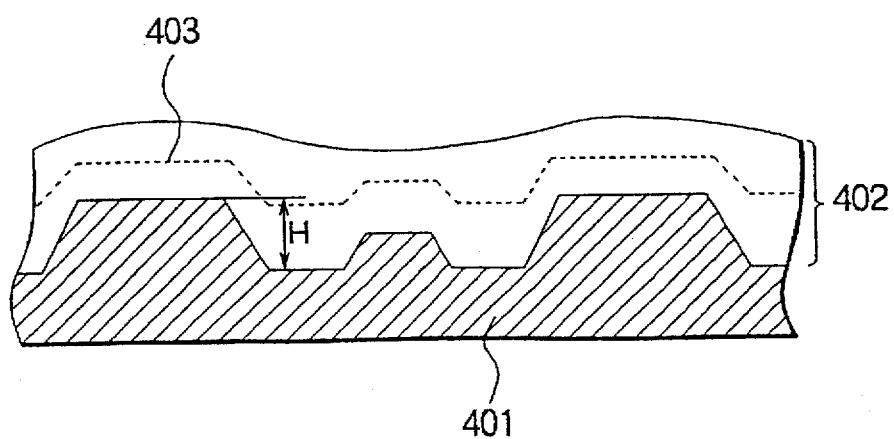
FIG. 8 is a sectional view of a semiconductor wafer scanned by the project aligner of FIG. 3, showing a focal position profile within the photoresist film.

The signal processor calculates the optimum focal position at each focusing position of the photoresist surface and actuates the optical system to obtain the optimum focal position. FIG. 8 shows an optimum focal position profile obtained with respect to the wafer structure which is similar to that shown in FIG. 2.

Figure 1:
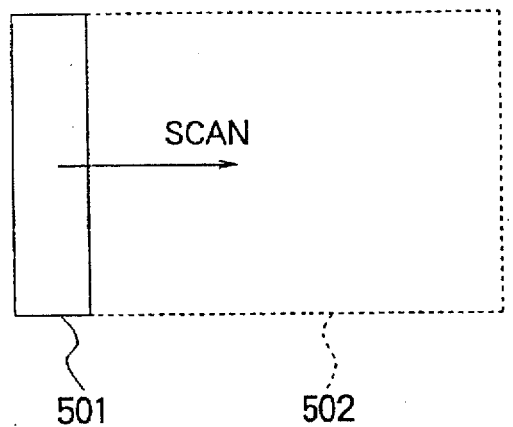
FIG. 1 is a plan view of a chip of a semiconductor wafer during step-and scan exposure by an exposure slit.
Figure 2:
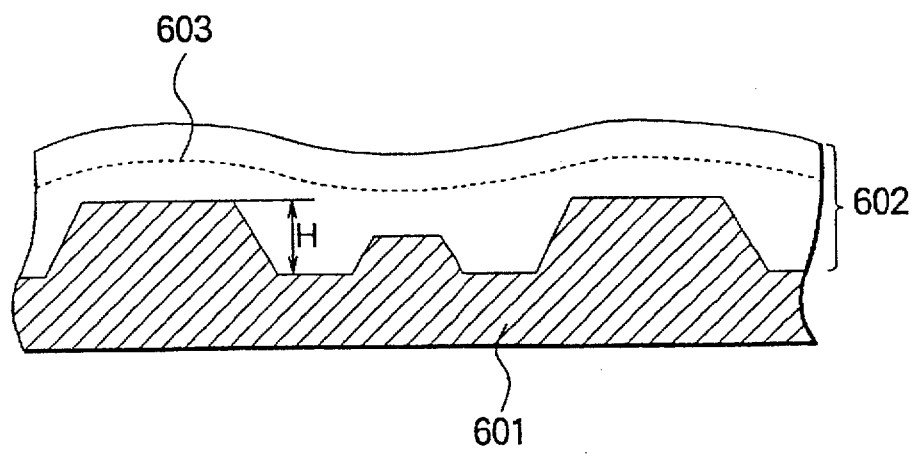
FIG. 2 is a sectional view of the semiconductor wafer during the step-an-scan exposure.

The focal position which is obtained by the conventional method will be discussed herein for understanding advantages of the present invention. It is assumed that the photoresist has a characteristic wherein the optimum focal position resides at the center of the photoresist film in the vertical direction. If a maximum step difference in the vertical direction within the wafer surface, as designated at "H" in the FIG. 2, is 1.5 microns, and a photoresist film having a minimum thickness of about 1 micron is formed on the wafer 601, the photoresist film thickness has a maximum of about 2 microns. In this case, the offset amount of the optimum focal position 603 with respect to the photoresist surface includes as high as 0.5 micron in difference between the maximum thickness position and the minimum thickness position of the photoresist film 602.

If the conventional method is applied to a 256 megabit DRAM using a 0.25-micron design rule, the margin of the focal position for the 0.25-micron wide interconnects will be as low as 0.5 microns provided that the lens aperture of NA=0.5 is applied to a KrF excimer laser exposure. The margin will be reduced down to a critical of 0.2 microns if it is assumed that 0.3-micron error occurs due to the error of the positioning for the focal position presented by the wafer stage drives and lens aberration.

On the other hand, the projection aligner according to the embodiment provides the optimum focal position profile, as shown in FIG. 8. Specifically, the signal processor finds the optimum focal position at each of the focusing positions on the wafer by calculating a half of the photoresist thickness, for example, as the optimum offset amount of the focal position from the photoresist surface. The optimum focal position is being obtained point by point while executing step-and-scan operation across the photoresist surface. Accordingly, a sufficient margin for the focal position is maintained by the present invention so that a high throughput for a semiconductor device can be attained.

Figure 9:
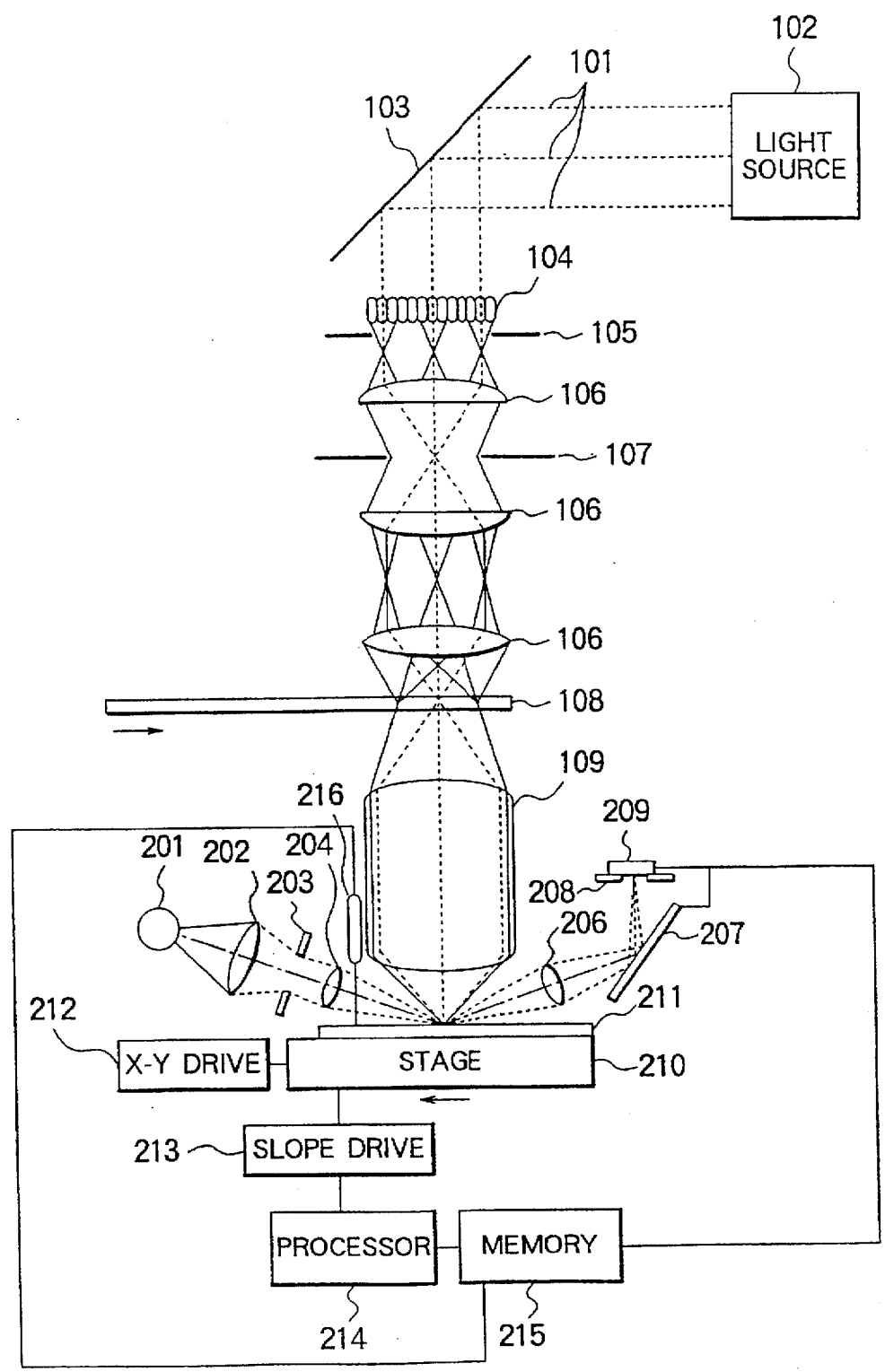
FIG. 9 is a schematic side view of a projection aligner using a step-and-scan technique according to a second embodiment of the present invention.

FIG. 9 shows a projection aligner using a step-and-scan technique according to a second embodiment of the present invention, wherein similar constituent elements are designated by the same reference numerals as those in FIG. 3. The projection aligner of the present embodiment is similar to the first embodiment except for a measurement device 216 for the photoresist film thickness. The film thickness measurement device 216 is provided at the forward position in the scanning direction with respect to the position of the exposure light. The signal processor 214 obtains a thickness data of the photoresist film at each focusing position on the wafer surface from the measurement device 216 just prior to the scanning exposure for the each focusing position and retrieves the data stored in the memory device 215, to thereby obtain an optimum focal position at the each focusing position.

Figure 10:
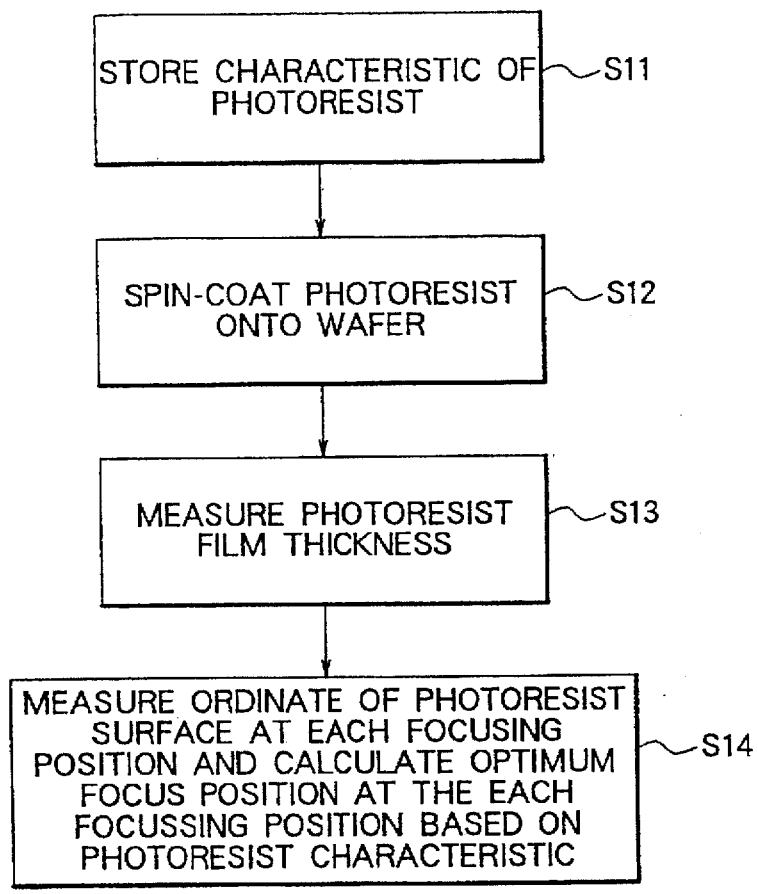
FIG. 10 is a flowchart of the process used in the projection aligner of FIG. 9.

FIG. 10 shows the operation for the second embodiment in a flowchart, wherein first step S11 is similar to step S1 of the first embodiment, and photoresist film thickness is measured at a single step S13 between the formation of the photoresist film at step S12 and scanning exposure at step S14 in the present embodiment. By this configuration, step-and-scan operation in this embodiment is executed at a higher throughput.

With the embodiments of the present invention wherein it is assumed that a lens aperture of NA=0.5 is applied to a KrF excimer laser for scanning a 256 megabit DRAM, a focus margin of 1 micron can be obtained for 0.25-micron wide interconnects on a substantially planar surface. Further, a sufficient focus margin of 0.7 micron can be obtained on a surface having a significant step difference on the wafer surface, even assuming that the focus margin is reduced by 0.3 microns due to the error of focal position with respect to the photoresist surface presented by the stage drives and due to a lens aberration.

Although the present invention is described with reference to preferred embodiments thereof, the present invention is not limited thereto and various modifications or alterations can be easily made from the embodiments by those skilled in the art without departing from the scope of the present invention as set forth in the appended claims.

What is claimed is:

1. A method for step-and-scan exposure of a film on a semiconductor wafer, comprising the steps of measuring a film thickness at each focusing position of a film surface, retrieving an optimum offset amount of a focal position from the film surface based on a photoresist characteristic and the measured film thickness at the each focusing position, and exposing the film for patterning with an exposure light having a focal point defined by the optimum offset amount.

2. A method for step-and-scan exposure as defined in claim 1 wherein said measuring step includes measuring a first ordinate of the wafer surface at the each focusing position, measuring a second ordinate of the film surface at the each focusing position, and subtracting the first ordinate from the second ordinate.

3. A method for step-and-scan exposure as defined in claim 1 wherein said film is a photoresist film.

4. A method for step-and-scan exposure as defined in claim 1 wherein said film characteristic includes a relationship between a film thickness and an optimum offset amount of a focal position from the film surface for the film thickness.

5. An apparatus for step-and-scan exposure of a semiconductor device comprising a measurement device for measuring a film thickness at each focusing position of a film on a semiconductor wafer, a memory device for storing a relationship between a film thickness and an optimum offset amount of a local position from a film surface for the film thickness, a read device for retrieving an optimum offset amount of a focal position from the film surface at each focusing position based on the film thickness, and an exposure device for exposing the film at the each focusing point with an exposure light having a focal point defined by the optimum offset amount.

6. An apparatus for step-and-scan exposure as defined in claim 5 wherein said measurement device includes a first measurement section for measuring a first ordinate of the wafer surface, a second measurement section for measuring a second ordinate of the film surface, and a calculating section for subtracting the first ordinate from the second ordinate.

* * * * *

UNITED STATES PATENT AND TRADEMARK OFFICE
CERTIFICATE OF CORRECTION

PATENT NO.   : 5,744,814
DATED        : April 28, 1998
INVENTOR(S)  : UCHIYAMA

It is certified that error appears in the above-identified patent and that said Letters Patent is hereby corrected as shown below:

Claim 5, Col. 6, line 23, "local" should be --focal--.

Signed and Sealed this

Eighteenth Day of August, 1998

Attest:

BRUCE LEHMAN

*Attesting Officer*   *Commissioner of Patents and Trademarks*